United States Patent
Watanabe et al.

(10) Patent No.: US 10,691,022 B2
(45) Date of Patent: Jun. 23, 2020

(54) PROCESSING METHOD AND PROCESSING APPARATUS

(71) Applicant: FUJIFILM Corporation, Tokyo (JP)

(72) Inventors: Toshihiro Watanabe, Haibara-gun (JP); Nobuyoshi Kaneko, Haibara-gun (JP); Masato Shirakawa, Haibara-gun (JP)

(73) Assignee: FUJIFILM Corporation, Minato-ku, Tokyo (JP)

( * ) Notice: Subject to any disclaimer, the term of this patent is extended or adjusted under 35 U.S.C. 154(b) by 0 days.

(21) Appl. No.: 16/585,253

(22) Filed: Sep. 27, 2019

(65) Prior Publication Data
US 2020/0026193 A1    Jan. 23, 2020

Related U.S. Application Data

(63) Continuation of application No. PCT/JP2018/008362, filed on Mar. 5, 2018.

(30) Foreign Application Priority Data

Mar. 31, 2017   (JP) ................................. 2017-070247

(51) Int. Cl.
   *G03D 3/00*   (2006.01)
   *G03F 7/30*   (2006.01)
   (Continued)

(52) U.S. Cl.
   CPC .............. *G03F 7/3092* (2013.01); *B04B 1/04* (2013.01); *B04B 5/10* (2013.01); *B04B 13/00* (2013.01)

(58) Field of Classification Search
   USPC ....................................................... 396/564
   See application file for complete search history.

(56) References Cited

U.S. PATENT DOCUMENTS 4,752,283 A    6/1988   Copeland et al.
4,944,874 A *  7/1990   Kobayashi ............ B01D 33/11
                                                 210/232

(Continued)

FOREIGN PATENT DOCUMENTS

JP   H06-504230 A    5/1994
JP   H07-328620 A   12/1995

(Continued)

OTHER PUBLICATIONS

International Search Report dated May 15, 2018 in International Application No. PCT/JP2018/008362.

(Continued)

*Primary Examiner* — Rodney E Fuller
(74) *Attorney, Agent, or Firm* — Sughrue Mion, PLLC

(57) ABSTRACT

Provided are a processing method and a processing apparatus in which a concentration of a solid content of a development fatigue liquid is low and a moisture content of a discharged solid substance is small. The processing method is a method for removing a first solid substance having a smaller specific gravity than the washout liquid and a second solid substance having a larger specific gravity than the washout liquid from a development fatigue liquid including a solid substance generated by removal of a non-exposed portion of a photosensitive resin plate that has been exposed in an image shape by development using the washout liquid. The method includes a first step of centrifugally separating the first solid substance and the second solid substance included in the development fatigue liquid in a rotating container, accumulating the second solid substance on an inner wall of the container, and accumulating the first solid substance on a holding member provided in the container, a second step of discharging the development fatigue liquid from the container in a state in which the first solid substance accumulated on the holding member is held on the holding (Continued)

member, and a third step of rotating the container, thereby removing the first solid substance held on the holding member from the holding member.

18 Claims, 9 Drawing Sheets

(51) Int. Cl.
*B04B 1/04* (2006.01)
*B04B 5/10* (2006.01)
*B04B 13/00* (2006.01)

(56) References Cited

U.S. PATENT DOCUMENTS

| | | | | |
|---|---|---|---|---|
| 5,176,825 | A * | 1/1993 | Hadjis | E03F 5/14 210/259 |
| 5,505,863 | A | 4/1996 | Danon et al. | |
| 6,247,856 | B1 * | 6/2001 | Shibano | G03F 7/3092 396/565 |
| 6,507,161 | B2 * | 1/2003 | Fair | B04B 9/10 210/360.1 |
| 2005/0252402 | A1 * | 11/2005 | Mackel | G03F 7/3092 101/483 |
| 2006/0054560 | A1 | 3/2006 | Hendrickson et al. | |
| 2007/0114161 | A1 * | 5/2007 | Carr | B01D 21/262 210/96.2 |
| 2010/0047718 | A1 * | 2/2010 | Takeuchi | C02F 1/56 430/300 |
| 2015/0177622 | A1 * | 6/2015 | Horiuchi | B01D 19/0052 430/331 |

FOREIGN PATENT DOCUMENTS

| | | |
|---|---|---|
| JP | H11-047638 A | 2/1999 |
| JP | 2000-056472 A | 2/2000 |
| JP | 2011255257 A | 12/2011 |
| WO | 2012078052 A1 | 6/2012 |

OTHER PUBLICATIONS

Written Opinion dated May 15, 2018 in International Application No. PCT/JP2018/008362.
International Preliminary Report on Patentability with the translation of Written Opinion dated Oct. 1, 2019 in International Application No. PCT/JP2018/008362.
Communication dated Mar. 30, 2020 from the European Patent Office in application No. 18776087.1.

* cited by examiner

PROCESSING METHOD AND PROCESSING APPARATUS

CROSS-REFERENCE TO RELATED APPLICATIONS

This application is a Continuation of PCT International Application No. PCT/JP2018/008362 filed on Mar. 5, 2018, which claims priority under 35 U.S.C. § 119(a) to Japanese Patent Application No. 2017-070247 filed on Mar. 31, 2017. The above application is hereby expressly incorporated by reference, in its entirety, into the present application.

BACKGROUND OF THE INVENTION

1. Field of the Invention

The present invention relates to a processing method and a processing apparatus of a development fatigue liquid and particularly to a processing method and a processing apparatus of a development fatigue liquid including a solid substance generated by the removal of a non-exposed portion of a photosensitive resin plate that has been exposed in an image shape by development using a washout liquid.

2. Description of the Related Art

As a method for developing a printing plate for which a photosensitive resin plate is used, a variety of methods are known. For example, in a development method in which development is carried out using an aqueous developer containing water as a main component, a photosensitive resin plate that has been exposed in an image shape is immersed in the aqueous developer, and a non-cured resin or the like that is a non-exposed portion is washed out into the aqueous developer using a brush or the like, thereby carrying out development. In this case, the non-cured resin or the like is present in the developer in a dispersed state. Regarding a developer in which a non-cured resin or the like is present in a dispersed state, the reuse of the developer after the removal of the dispersed non-cured resin is being proposed. Here, the above-described developer is also referred to as a washout liquid.

For example, JP1995-328620A (JP-H7-328620A) describes a method for treating a washout liquid including a solid substance that is generated at the time of development in which a non-exposed portion is removed while a photosensitive resin plate that has been exposed is immersed in the washout liquid. JP1995-328620A (JP-H7-328620A) describes that a solid substance having a smaller specific gravity than the washout liquid is separated and removed using centrifugal sedimentation-type centrifugal separation processing having an inside disc and a treated liquid from which the solid substance having a smaller specific gravity than the washout liquid has been separated and removed is further reused as a washout liquid.

SUMMARY OF THE INVENTION

In JP1995-328620A (JP-H7-328620A), the solid substance having a smaller specific gravity than the washout liquid is separated and removed using centrifugal sedimentation-type centrifugal separation processing having an inside disc. However, in JP1995-328620A (JP-H7-328620A), the separated washout liquid is collected using a skimming tube, and thus, in a case where a large amount of the solid substance is mixed into the washout liquid due to the amount of the solid substance in a dispersed state changed due to the concentration of the solid substance mixed in, the concentration of the solid substance in the treated washout liquid increases.

In addition, recently, a flexographic plate material having a black layer applied onto a surface, which is adaptable to computer-to-plate (CTP), has emerged, and a demand for separating a solid substance having a larger specific gravity than the washout liquid at the same time has been intensifying. In JP1995-328620A (JP-H7-328620A), it is possible to separate both the solid substance having a larger specific gravity than the washout liquid and the solid substance having a smaller specific gravity than the washout liquid.

In JP1995-328620A (JP-H7-328620A), in the case of a batch-type method, the trapped solid substance in a dispersed state needs to be removed after stopping rotation for centrifugal separation. As a removal method, (i) a method in which the solid substance is removed manually using a caulking knife, (ii) a method in which a scraper is installed in a centrifugal separator, the scraper is inserted into a rotor which is being rotated at a slow rate, and the solid substance is scraped, and (iii) a method in which a sac-like substance or molded product is embedded in a rotor and a substance in each of the embedded members is removed are exemplified.

In JP1995-328620A (JP-H7-328620A), with any of the above-described methods (i) to (iii), it is not possible to scrap only the washout liquid. Therefore, in the case of removing both the solid substance having a larger specific gravity than the washout liquid and the solid substance having a smaller specific gravity than the washout liquid, the moisture content increases due to a large amount of the washout liquid mixed in, and, in the case of disposing of the solid substance as a solid waste, the amount of the solid substance disposed of increases. In addition, JP1995-328620A (JP-H7-328620A) describes the reuse of the treated washout liquid; however, in a case where the moisture content increases as described above, the amount of the reusable washout liquid decreases.

An object of the present invention is to provide a processing method and a processing apparatus in which a concentration of a solid content of a development fatigue liquid is low and a moisture content of a discharged solid substance is small.

In order to achieve the above-described object, the present invention provides a processing method for removing a first solid substance having a smaller specific gravity than a washout liquid and a second solid substance having a larger specific gravity than the washout liquid from a development fatigue liquid including a solid substance generated by removal of a non-exposed portion of a photosensitive resin plate that has been exposed in an image shape by development using the washout liquid, the method comprising: a first step of centrifugally separating the first solid substance and the second solid substance included in the development fatigue liquid in a rotating container, accumulating the second solid substance on an inner wall of the container, and accumulating the first solid substance on a holding member provided in the container; a second step of stopping the centrifugal separation and discharging the development fatigue liquid from the container in a state in which the first solid substance accumulated on the holding member is held on the holding member; and a third step of rotating the container, thereby removing the first solid substance held on the holding member from the holding member.

The processing method preferably has a step of removing the second solid substance from the container between the second step and the third step and has a step of removing the first solid substance from the container after the third step.

The processing method preferably has a step of removing the first solid substance and the second solid substance from the container at the same time after the third step.

The processing method preferably has a step of reusing the development fatigue liquid discharged from the container as the washout liquid or a step of passing the development fatigue liquid discharged from the container through a separation film that removes the solid substance generated by the development and reusing the development fatigue liquid as the washout liquid.

In addition, the development fatigue liquid discharged from the container may be reused as a rinse liquid that washes away a gas remaining on a plate surface after the development and removal of the non-exposed portion.

In addition, the present invention provides a processing apparatus comprising: a container that has an opening portion and stores a development fatigue liquid including a solid substance generated by removal of a non-exposed portion of a photosensitive resin plate that has been exposed in an image shape by development using a washout liquid; a driving portion that centrifugally separates a first solid substance having a smaller specific gravity than the washout liquid and a second solid substance having a larger specific gravity than the washout liquid in the container by rotating the container; a confining member that is provided in the container so as to face the opening portion and stores the first solid substance in the container; at least one holding member that is provided in the container opposite to the opening portion across the confining member and holds the first solid substance that is accumulated by the centrifugal separation; and a control portion that rotates the container in which the development fatigue liquid is stored by the driving portion to carry out the centrifugal separation, accumulates the first solid substance on the holding member, stops rotation of the container by the driving portion, discharges the development fatigue liquid from the container in a state in which the first solid substance accumulated on the holding member is held on the holding member, and then rotates the container by the driving portion again.

The processing apparatus preferably has a removal portion that removes the first solid substance and the second solid substance present in the container from the container.

It is preferable that the confining member is a circular plate having an opening and the holding member is a circular plate or a circular plate having an opening.

It is preferable that the processing apparatus has a separation film that removes the solid substance generated by the development and the development fatigue liquid discharged from the container is reused as the washout liquid after being passed through the separation film or is reused as the washout liquid without being passed through the separation film.

The development fatigue liquid discharged from the container is preferably reused as the washout liquid.

According to the present invention, it is possible to provide a processing method and a processing apparatus in which a concentration of a solid content of a development fatigue liquid is low and a moisture content of a discharged solid substance is small.

DESCRIPTION OF THE PREFERRED EMBODIMENTS

Hereinafter, a processing method and a processing apparatus of an embodiment of the present invention will be described in detail on the basis of preferred embodiments shown in the accompanying drawings.

Meanwhile, drawings to be described below are exemplary drawings for describing the present invention, and the present invention is not limited to the drawings to be described below.

Numerical ranges expressed below using "to" include numerical values described on both sides. For example, an expression "ε is a numerical value $\alpha_1$ to a numerical value $\beta_2$" indicates that the range of ε is a range including the numerical value $\alpha_1$ and the numerical value $\beta_2$ and is expressed as $\alpha_1 \leq \varepsilon \leq \beta_2$ using mathematical signs.

Unless particularly otherwise described, angles such as "an angle expressed using a specific numerical value" and "being perpendicular" include an error range that is ordinarily permitted in the corresponding technical field.

Figure 1:
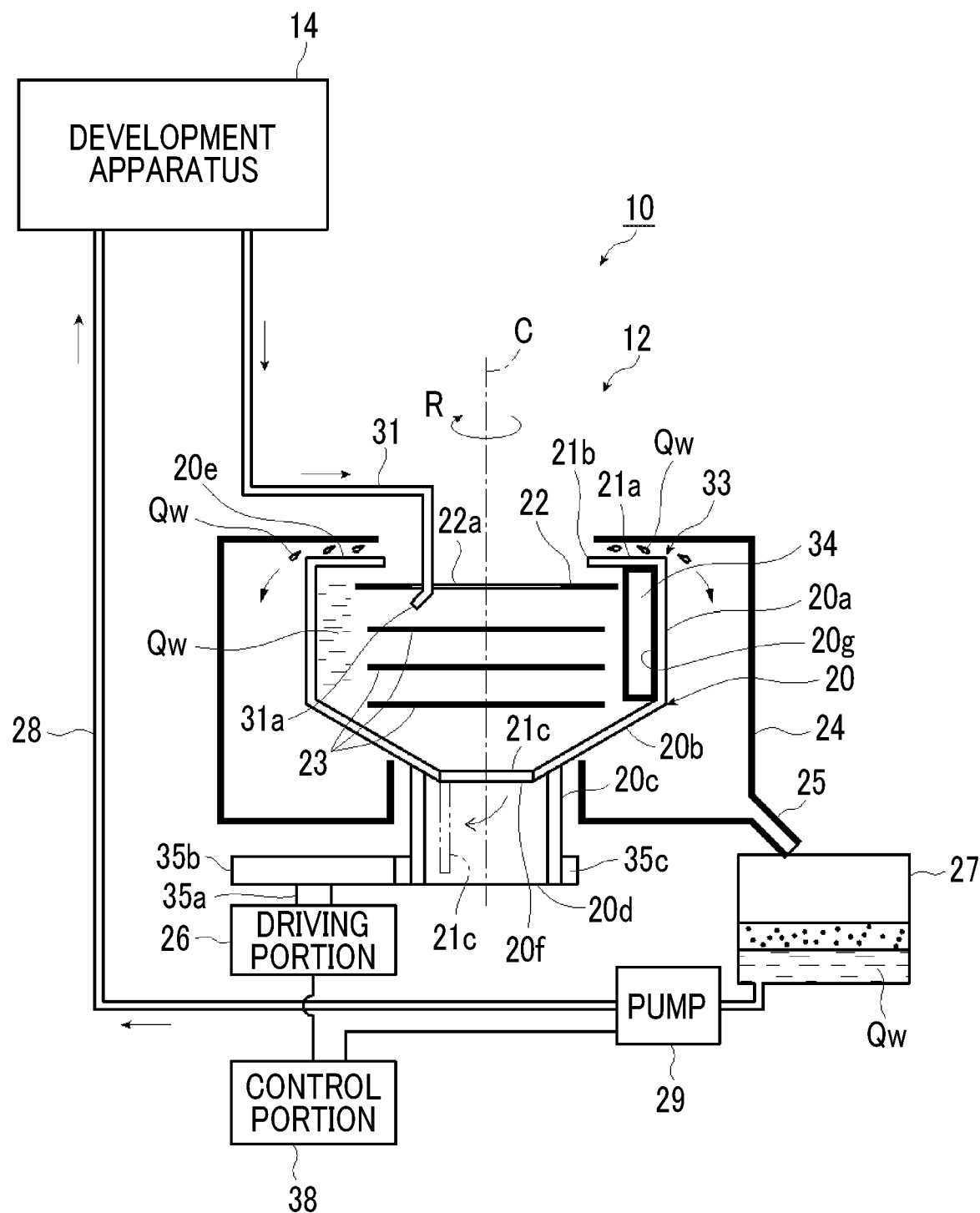
FIG. 1 is a schematic view showing a processing system having an example of a processing apparatus of an embodiment of the present invention.
Figure 2:
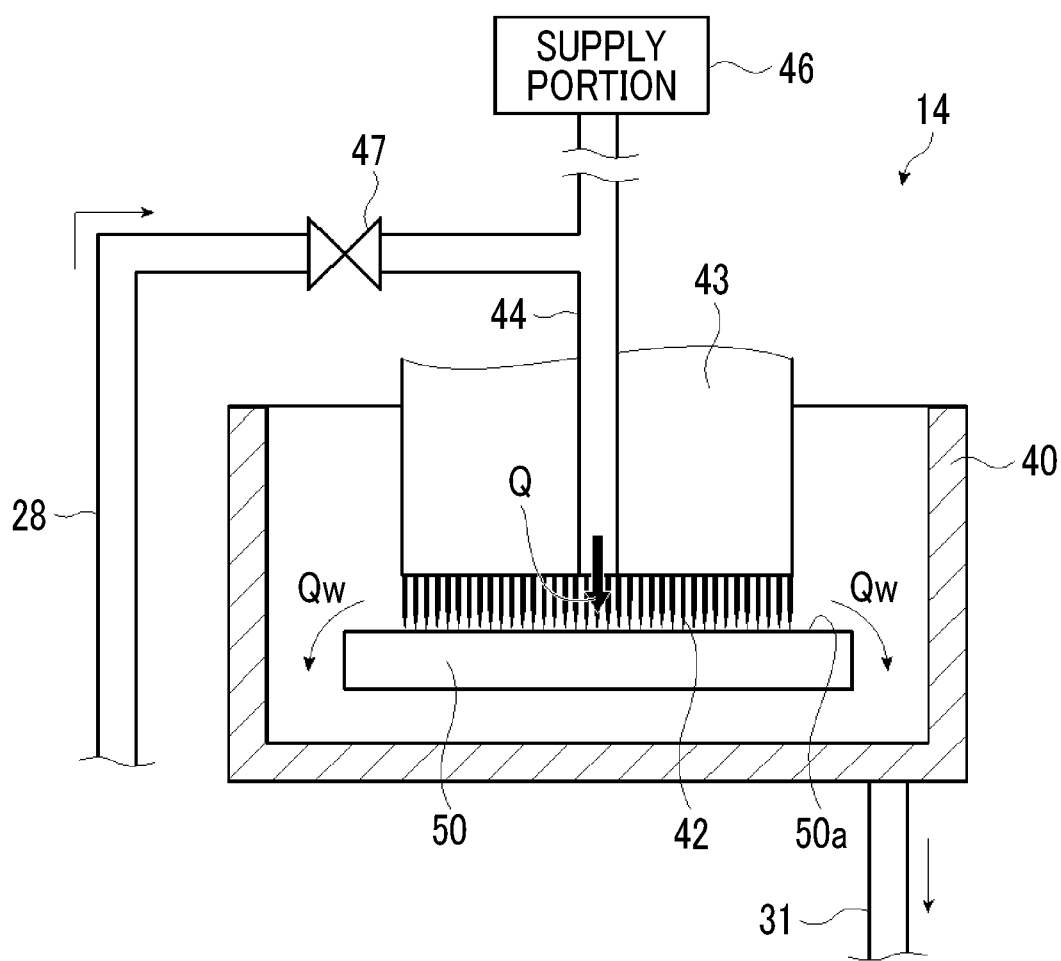
FIG. 2 is a schematic view showing an example of a development apparatus.

FIG. 1 is a schematic view showing a processing system having an example of the processing apparatus of the embodiment of the present invention, and FIG. 2 is a schematic view showing an example of the development apparatus.

A processing system 10 shown in FIG. 1 has a processing apparatus 12 and a development apparatus 14, and the processing apparatus 12 is connected to the development apparatus 14.

In the development apparatus 14, a development fatigue liquid including a solid substance generated by the removal of a non-exposed portion of a photosensitive resin plate that has been exposed in an image shape by development using a washout liquid is generated. The development fatigue liquid is supplied from the development apparatus 14 to the processing apparatus 12 through a pipe 31.

The processing apparatus 12 centrifugally separates a development fatigue liquid Qw into a first solid substance 36 having a smaller specific gravity than the washout liquid included in the development fatigue liquid Qw and a second solid substance 37 having a larger specific gravity than the washout liquid in a rotating container 20. The separated first solid substance 36 and second solid substance 37 are removed from the container 20.

The processing apparatus 12 is, for example, an apparatus that carries out centrifugal sedimentation-type centrifugal separation and has the container 20, an inside disc 22, a keeper disc 23, a case 24, a driving portion 26, a pump 29, a removal portion 33, and a control portion 38. The driving portion 26 and the pump 29 are connected to the control portion 38, and the operation of the driving portion 26 and the pump 29 is controlled by the control portion 38. In addition, the operation of the removal portion 33 is also controlled by the control portion 38.

The container 20 is a container that stores the development fatigue liquid Qw and is formed by integrating a cylindrical trunk portion 20a, a conical frustum-shaped slope portion 20b, and a cylindrical bottom portion 20c. A lid 21a is provided in an opening 20e of the trunk portion 20a. The lid 21a is constituted of a member having a round band shape in a plan view and has an opening portion 21b. In the container 20, the trunk portion 20a is present on the upper side, the bottom portion 20c is present on the lower side, and the opening portion 21b is disposed on the upper side.

A shutter 21c is provided in an opening portion 20f of the slope portion 20b. The shutter 21c is openable and closable, and, in a state in which the shutter 21c is closed, the slope portion 20b and the bottom portion 20c are not communicated with each other.

A driving shaft 35a is provided in the driving portion 26, and a driving gear 35b is provided on the driving shaft 35a. A driven gear 35c is provided in the circumference of the bottom portion 20c, and the driving gear 35b and the driven gear 35c are engaged with each other. In the case of rotating the driving shaft 35a using the driving portion 26, the driving gear 35b rotates, the driven gear 35c rotates, and the container 20 rotates. As described above, it is possible to transfer the rotation of the driving shaft 35a generated by the driving portion 26 to the container 20. The driving portion 26 rotates the container 20, for example, in a direction R around a central axis C as the rotation axis, thereby separating the first solid substance 36 having a smaller specific gravity than the washout liquid included in the development fatigue liquid Qw and the second solid substance 37 having a larger specific gravity than the washout liquid in the container 20. The container 20 also functions as a rotating body. The driving portion 26 is configured of, for example, a motor. In a case where the container 20 can be rotated using the driving portion 26, not only a combination of the driving shaft 35a, the driving gear 35b, and the driven gear 35c but also a combination of a driving shaft, a pulley, and a transmission belt can be used.

In the centrifugal separation, in the case of being expressed using a centrifugal effect G that is a multiple of the acceleration of gravity, while also depending on the size of the solid substance in a dispersed state, a necessary acceleration is preferably 300 G or more in a case where the particle diameter is 1 μm or more and is preferably 500 G or more in order to achieve a more sufficient removal processing effect. Meanwhile, the necessary acceleration is preferably 1,000 G or more in a case where the particle diameter is less than 1 μm. Therefore, as the driving portion 26, a driving portion capable of generating the above-described centrifugal effect G is used. The rotation speed (revolution per minute (rpm)) and rotation time of the container 20 by the driving portion 26 and the rotation timing of the container 20 are controlled using the control portion 38.

In a processing method to be described below, the control portion 38 rotates the container 20 in which the development fatigue liquid Qw is stored by the driving portion 26 to carry out centrifugal separation, accumulates the first solid substance 36 on the keeper disc 23, stops the rotation of the container 20 by the driving portion 26 to discharge the development fatigue liquid Qw from the container 20 in a state in which the first solid substance 36 accumulated on the keeper disc 23 is held on the keeper disc 23, and then, again, rotates the container 20 by the driving portion 26.

Figure 5:
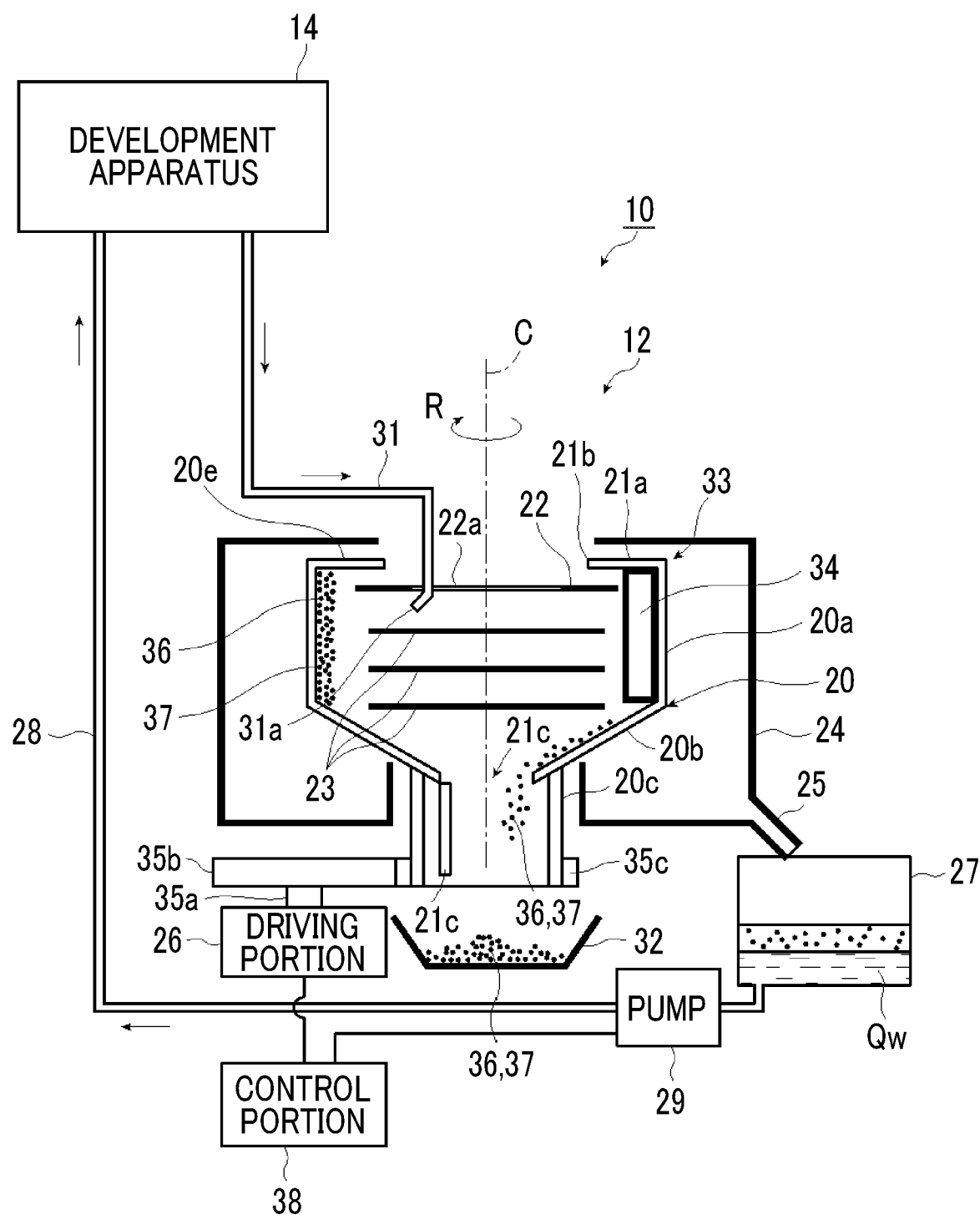
FIG. 5 is a schematic view showing a step of the processing method in which the processing system having an example of the processing apparatus of the embodiment of the present invention is used.

While not shown in detail, the bottom portion 20c is capable of opening and closing a bottom surface 20d. As shown in FIG. 5, the solid substance in the container 20 can be discharged to the outside by opening the shutter 21c and the bottom surface 20d. In this case, the solid substance in the container 20 is collected by disposing a tray 32 (refer to FIG. 5), for example, below the bottom surface 20d.

A confining member is provided in the container 20 in contact with the opening portion 21b. The confining member is intended to fasten the first solid substance 36 in the container 20. The confining member is, for example, the inside disc 22.

At least one holding member is provided in the container 20 opposite to the opening portion 21b across the confining member. The holding member is intended to hold the first solid substance 36 that is accumulated by the centrifugal separation. The holding member is, for example, the keeper disc 23, and the processing apparatus 12 in FIG. 1 has three keeper discs 23.

The inside disc 22 and the three keeper discs 23 are separated from each other and are disposed to superimpose each other.

The inside disc 22 is disposed on the lid 21a side so as to face the opening portion 21b, and the three keeper discs 23 are disposed opposite to the opening portion 21b across the inside disc 22. Meanwhile, the number of the keeper discs 23 provided does not have to be plural and simply needs to be at least one.

The inside disc 22 and the keeper discs 23 are both fixed in the container 20 and are configured to rotate together with the container 20 in a case where the container 20 rotates, but the configuration thereof is not limited thereto. As long as a centrifugal force can be exerted on the first solid substance 36 held on the keeper discs 23 in a case where the container 20 rotates the installation state of the inside disc 22 and the keeper discs 23 with respect to the container 20 is not particularly limited.

The case 24 is intended to cover the container 20 and stores the development fatigue liquid Qw overflowed from the opening portion 21b of the container 20. In addition, the container 20 and the case 24 can be communicated with each other through an openable and closable discharge opening (not shown) provided in the slope portion 20b of the container 20. Therefore, the development fatigue liquid Qw in the container 20 can be discharged to the case 24.

A discharge path 25 that serves as a flow path of the development fatigue liquid Qw from the case 24 to a defoaming tank 27 is provided in the case 24. The development fatigue liquid Qw in the case 24 passes through the discharge path 25 and is stored in the defoaming tank 27.

Figure 9:
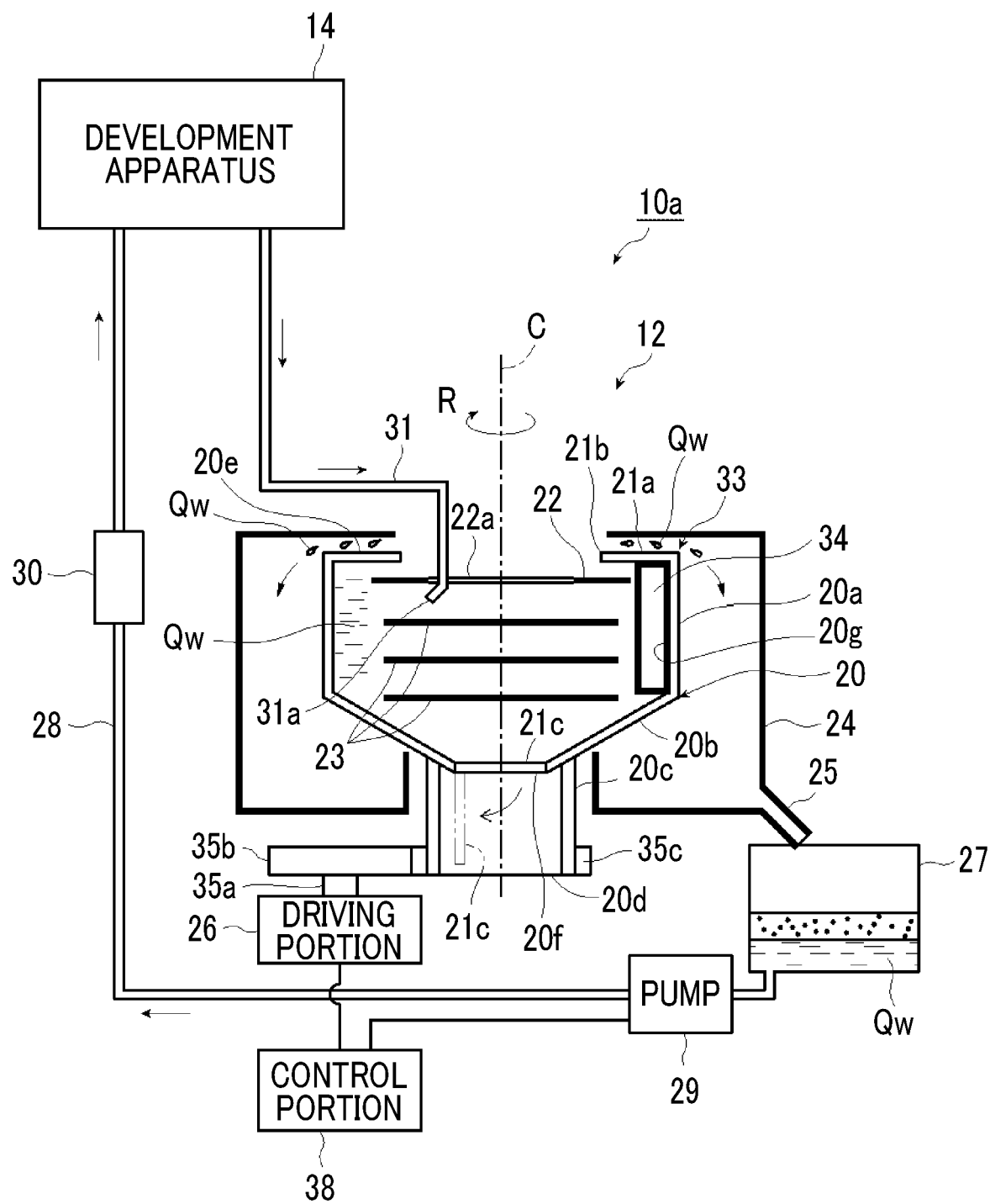
FIG. 9 is a schematic view showing a processing system having an example of a processing apparatus of another embodiment of the present invention.

The defoaming tank 27 and the development apparatus 14 are connected through a pipe 28. The pump 29 is provided in the pipe 28. In FIG. 9 which is a schematic view showing a processing system 10a having an example of a processing apparatus of another embodiment of the present invention, furthermore, a separation film 30 is provided at a location closer to the development apparatus 14 than the pump 29. The separation film 30 is intended to separate a solid substance that is generated by development. Therefore, the separation film 30 is not particularly limited as long as the separation film is capable of separating a solid substance included in the development fatigue liquid Qw and is appropriately determined depending on the size of a solid substance to be separated. The separation film 30 is not essentially necessary and may not be provided as in the configuration of the processing system 10 shown in FIG. 1. In this case, there is no case where the development fatigue liquid Qw passes through the separation film 30, and the development fatigue liquid Qw stored in the defoaming tank 27 is reused as it is. In addition, even in the case of having the separation film 30, the development fatigue liquid does not need to pass through the separation film 30 at all times. As described above, the development fatigue liquid Qw may be repetitively used without being caused to pass through the separation film 30.

However, the development fatigue liquid Qw is preferably caused to pass through the separation film 30 since the concentration of the solid substance in the development fatigue liquid Qw that is sent back to the development apparatus 14 can be further decreased, and the development fatigue liquid Qw can be repetitively used.

Meanwhile, in the processing system 10a shown in FIG. 9, the same configuration substances as in the processing system 10 shown in FIG. 1 are given the same reference sign and will not be described in detail.

As a result of verifying the reuse of a treated agent from which the solid substance having a lower specific gravity than the washout liquid as a washout liquid as described in JP1995-328620A (JP-H7-328620A), a tendency of an increase in gas attached to a photosensitive resin plate during development was found.

As a result of an analysis, it was clarified that the solid substance having a lower specific gravity than the washout liquid includes a component having a particle diameter of 1 to 5 µm and a component having a particle diameter of 1 µm or less, almost all of the solid substance having a particle diameter of 1 to 5 µm is separated and removed, but the component having a particle diameter of 1 µm or less gradually increases. This is considered to be because a component that can be removed using a centrifugal separation apparatus is the solid substance having a particle diameter of 1 to 5 µm, and the component having a particle diameter of 1 µm or less cannot be removed, and thus the reuse increases the concentration thereof. From this fact, the separation film 30 is preferably a separation film capable of separating, for example, a solid substance having a particle diameter of 1 µm or less. As the separation film 30, for example, a filter having a separation capacity of 0.1 µm is used.

In the container 20, the pipe 31 that supplies the development fatigue liquid Qw to the inside of the container 20 is disposed. The pipe 31 is connected to the development apparatus 14. For example, an opening 31a of the pipe 31 is disposed between the inside disc 22 and the uppermost keeper disc 23. The location of the opening 31a of the pipe 31 is not particularly limited as long as the opening is present on the lower side of the inside disc 22.

The configuration of the container is not particularly limited as long as the container 20 is capable of storing the development fatigue liquid Qw therein and does not plastically deform due to a centrifugal force that is exerted on the rotating container for centrifugal separation. As the container 20, it is possible to appropriately use, for example, a container that is used in a centrifugal sedimentation-type centrifugal separation apparatus. In this case, the container 20 has a hole-free configuration, that is, each of the trunk portion 20a, the slope portion 20b, and the bottom portion 20c is configured of a hole-free member. For example, as the container 20, a basket-type rotor is used.

In addition, the capacity of the container 20 is not particularly limited and is appropriately determined depending on the amount of the solid substance that is included in the development fatigue liquid Qw, the amount of plates produced in the development apparatus 14, and the like.

The inside disc 22 is intended to, similar to the above-described confining member, fasten the first solid substance 36 having a smaller specific gravity than the washout liquid in the container 20 and is configured of, for example, a circular plate having an opening 22a. The inside disc 22 is provided near the opening portion 21b in the container 20 so as to prevent the first solid substance 36 gathering in the container 20 from being discharged to the outside of the container 20 together with the development fatigue liquid Qw.

The first solid substance 36 gathering in the container 20 is blocked by the inside disc 22 and trapped in the container 20. The development fatigue liquid Qw passes through the outer edge side of the inside disc 22 and overflows to the case 24 from the opening portion 21b of the container 20.

The inside disc 22 is configured of a metal, a resin, or the like. The inside disc 22 preferably can be installed without removing the lid 21a, and, in this case, the inside disc 22 is configured of a flexible material, for example, a resin or the like.

The keeper disc 23 is intended to, similar to the above-described holding member, hold the first solid substance 36 that is accumulated at the tune of being centrifugally separated. In the case of discharging the development fatigue liquid Qw from the inside of the container 20, the first solid substance 36 accumulated on the keeper discs 23 is held on the keeper discs 23.

The holding member holds the first solid substance 36; however, in the end, the first solid substance 36 on the keeper discs 23 is removed from the keeper discs 23. From this fact, the keeper disc 23 is preferably configured of a flat plate on which the first solid substance 36 is easily accumulated and from which the first solid substance 36 is easily scattered during the rotation of the container 20. Therefore, the keeper disc 23 is configured of a circular plate having no opening.

However, the keeper discs 23 need to allow the first solid substance 36 to be accumulated thereon and are preferably capable of holding the first solid substance 36, and thus the keeper discs need to be present at a location at which the first solid substance 36 is accumulated according to the mass at least during the centrifugal separation. Therefore, the keeper disc 23 may be a circular plate having an opening as described below.

The keeper disc 23 is configured of, for example, metal. The keeper disc 23 can also be made of the same material as that of the inside disc 22.

The defoaming tank 27 is intended to store the development fatigue liquid Qw. The development fatigue liquid Qw is, first, supplied to the defoaming tank 27 and is sent back to the development apparatus 14 using the pump 29 after the removal of foam. The configuration of the defoaming tank 27 is not particularly limited as long as the defoaming tank is capable of storing the development fatigue liquid Qw.

The pump 29 is a member, as described above, to send the development fatigue liquid Qw in the defoaming tank 27 back to the development apparatus 14. The configuration of the pump 29 is not particularly limited as long as the pump is capable of sending the development fatigue liquid to the development apparatus 14 and is appropriately determined depending on the length of the pipe 28, the difference in height between the defoaming tank 27 and the development apparatus 14, and the amount of the development fatigue liquid Qw sent back.

The timing of sending back the development fatigue liquid Qw stored in the defoaming tank 27 using the pump 29 is controlled by the control portion 38.

The removal portion 33 has, for example, a scraper 34 and a moving portion (not shown) that moves the scraper 34. The scraper 34 is intended to scrape and remove an accumulated substance accumulated on an inner wall 20g of the container 20. The first solid substance 36 and the second solid substance 37 accumulated on the inner wall 20g are removed by the scraper 34.

The scraper 34 is configured of, for example, a flat plate capable of moving along the inner wall 20g. During the centrifugal separation, the scraper 34 is in a state of being fixed in the container 20 and rotates in the same direction R at the same rate as those of the container 20. In the case of being removed, the scraper 34 is rotated in a direction r (refer to FIG. 6) opposite to the direction R in which the container 20 rotates by the moving portion.

In the processing apparatus 12, the provision of the keeper discs 23 holds the first solid substance 36 on the keeper discs 23 during the collection of the development fatigue liquid Qw, and thus it becomes difficult for the first solid substance 36 to mix into the development fatigue liquid Qw, and it is possible to decrease the concentration of the solid substance in the development fatigue liquid Qw that is discharged from the container 20. Therefore, in a case where the development fatigue liquid Qw is reused as a washout liquid Q, an increase in the concentration of the solid substance is suppressed even in the case of repetitively reusing the development fatigue liquid, and consequently, the development fatigue liquid Qw can be reused as a washout liquid a larger number of times.

In addition, due to the provision of the keeper discs 23, the development fatigue liquid Qw as well as the first solid substance 36 is also held on the keeper discs 23. Therefore, it is possible to decrease the moisture contents of the first solid substance 36 and the second solid substance 37 that have been discharged to the outside of the container 20.

Next, the development apparatus 14 will be described. The development apparatus 14 is intended to develop, for example, a photosensitive resin plate using an aqueous washout liquid.

The development apparatus 14 is provided with, for example, as shown in FIG. 2, a development tank 40 and a brush 42. The brush 42 is provided in a driving member 43. In addition, a supply pipe 44 is provided to the brush 42. The supply pipe 44 is connected to a supply portion 46. In the development apparatus 14, a washout liquid is supplied to a surface 50a of a photosensitive resin plate 50 from the supply portion 46 through the supply pipe 44 and the brush 42.

During development, while the washout liquid Q is supplied to the surface 50a of the photosensitive resin plate 50 from the brush 42, the driving member 43 is rotated by a driving portion not shown, thereby rubbing the surface 50a of the exposed photosensitive resin plate 50 with the brush 42. Therefore, a non-cured portion (not shown) after exposure is removed from the surface 50a of the photosensitive resin plate 50 and is discharged into the washout liquid Q. The washout liquid Q into which the non-cured portion (not shown) after exposure is discharged is referred to as the development fatigue liquid Qw. The washout liquid Q is also included in the scope of the development fatigue liquid Qw.

The development tank 40 is connected to the pipe 31. The development fatigue liquid Qw is sent out through the pipe 31.

The pipe 28 is connected to the supply pipe 44. A valve 47 is provided between the pipe 28 and the supply pipe 44. The communication between the pipe 28 and the supply pipe 44 is controlled by opening and closing the valve 47. In the case of not supplying the treated development fatigue liquid Qw to the supply pipe 44, the valve 47 is kept in a closed state.

The treated development fatigue liquid Qw passes through the pipe 28 and is supplied to the photosensitive resin plate 50 from the supply pipe 44. In this case, the valve 47 is kept in an open state. In the processing apparatus 12 of another embodiment shown in FIG. 9, the separation film 30 is provided in the pipe 28 as described above, and the treated development fatigue liquid Qw is supplied through the separation film 30.

A development method in the development apparatus 14 is not particularly limited and may be a batch-type method or a transportation-type method. In addition, the development apparatus 14 may be an aspect in which the washout liquid is sprayed to the photosensitive resin plate 50, thereby removing the non-exposed portion or an aspect in which the photosensitive resin plate 50 is immersed in the washout liquid, thereby removing the non-exposed portion.

The configuration of the photosensitive resin plate 50 is not particularly limited and is, for example, a plate that forms a flexographic printing plate that is used in flexographic printing. The photosensitive resin plate 50 is preferably a plate that can be developed using an aqueous developer containing water as a main component or a plate referred to as a water development-type flexographic printing plate. As the photosensitive resin plate 50, a well-known flexographic printing plate that can be developed using an aqueous developer is available, and a flexographic plate material having a black layer applied onto a surface, which is adaptable to computer-to-plate (CTP), may also be used.

Next, a processing method will be described.

Figure 3:
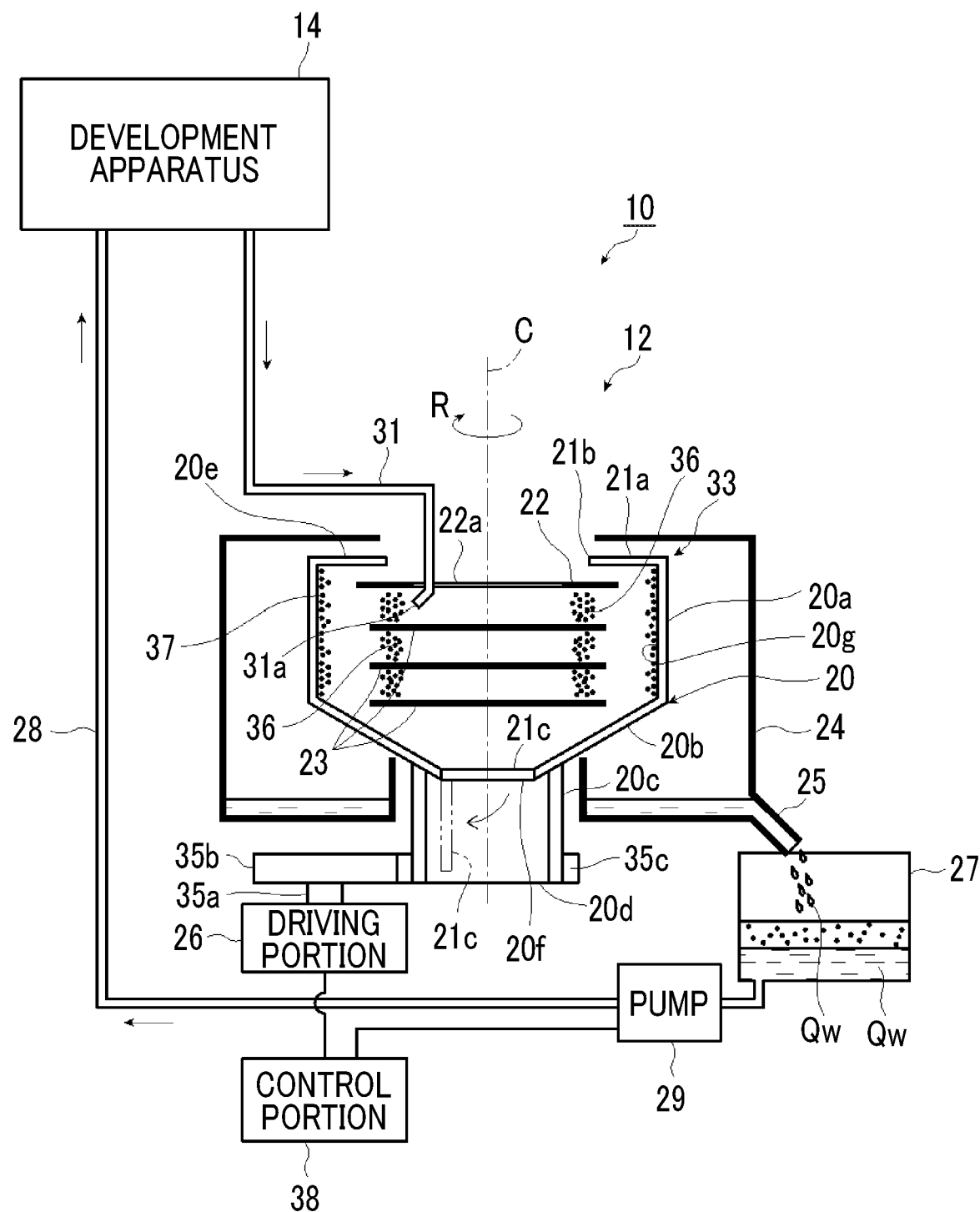
FIG. 3 is a schematic view showing a step of a processing method in which the processing system having an example of the processing apparatus of the embodiment of the present invention is used.
Figure 4:
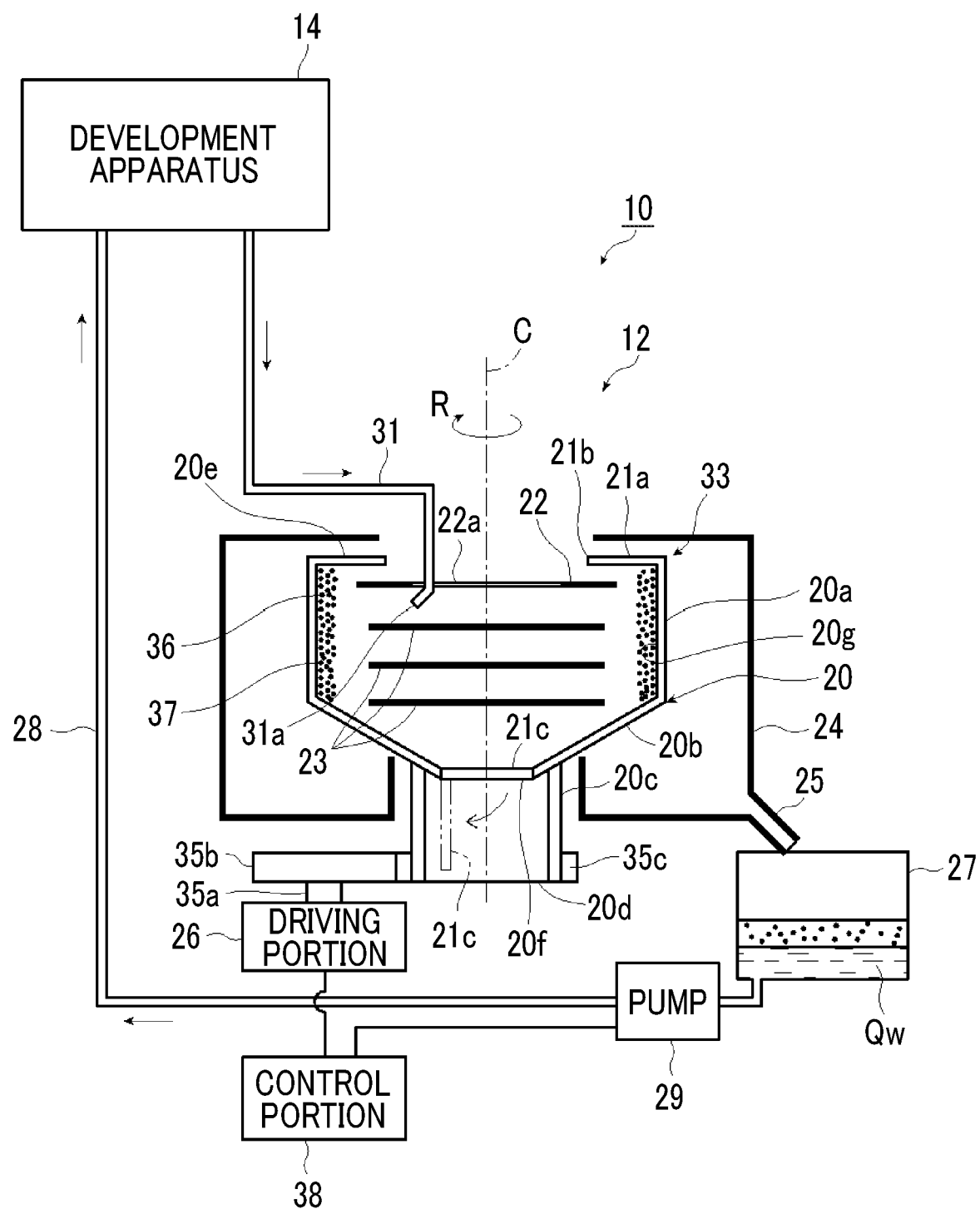
FIG. 4 is a schematic view showing a step of the processing method in which the processing system having an example of the processing apparatus of the embodiment of the present invention is used.

Schematic views shown in FIG. 3 to FIG. 5 show steps of a processing method in order in which a processing system having an example of the processing apparatus of the embodiment of the present invention is used. In the processing apparatus shown in FIG. 3 to FIG. 5, the same configuration substances as in the processing system 10 shown in FIG. 1 are given the same reference sign and will not be described in detail. In addition, in FIG. 3 and FIG. 4, the scraper 34 is not shown.

In the processing method, first, the surface 50a (refer to FIG. 2) of the photosensitive resin plate 50 (refer to FIG. 2) is exposed in an image shape, that is, exposed in a specific pattern using an exposure apparatus (not shown).

The photosensitive resin plate 50 that has been exposed in an image shape is transported to the development apparatus 14, and, in the development tank 40 (refer to FIG. 2) of the development apparatus 14, the photosensitive resin plate 50 (refer to FIG. 2) is developed using the brush 42 (refer to FIG. 2) in the washout liquid Q. A solid substance generated by the removal of the non-exposed portion of the photosensitive resin plate 50 that has been exposed in an image shape by the development using the washout liquid Q disperses in the washout liquid Q (refer to FIG. 2). Therefore, the development fatigue liquid Qw including the solid substance is generated.

The development fatigue liquid Qw is supplied to the inside of the container 20 of the processing apparatus 12 through the pipe 31.

The container 20 is rotated around the central axis C as the rotation axis by the driving portion 26, thereby carrying out centrifugal separation. The centrifugal separation separates the solid substance included in the development fatigue liquid Qw in the container 20 according to the mass. The first solid substance 36 and the second solid substance 37 are centrifugally separated in the containers 20 under previously-specified centrifugal separation conditions such as the rotation speed, the rotation time, and the like, the second solid substance 37 is accumulated on the inner wall 20g of the container 20, and the first solid substance 36 is accumulated on the keeper discs 23 provided in the container 20 (first step). During the above-described centrifugal separation, a majority of the development fatigue liquid Qw in the container 20 overflows from the opening portion 21b and is stored in the case 24. The development fatigue liquid Qw discharged to the case 24 passes through the discharge path 25 and is stored in the defoaming tank 27.

The centrifugal separation is stopped by stopping the rotation of the container 20 by the driving portion 26. In addition, next, in a state in which the first solid substance 36 accumulated on the keeper discs 23 is held on the keeper discs 23, for example, a discharge opening (not shown) of the slope portion 20b is opened to communicate the container 20 and the case 24, and the development fatigue liquid Qw is discharged from the container 20 to the case 24 (second step). The development fatigue liquid Qw discharged to the case 24 is stored in the defoaming tank 27.

After the development fatigue liquid Qw is discharged to the case 24 of the container 20, as shown in FIG. 3, a state in which the second solid substance 37 is accumulated on the inner wall 20g of the trunk portion 20a of the container 20 and the first solid substance 36 is accumulated on the keeper discs 23 is formed.

Next, in a state in which the development fatigue liquid Qw is discharged from the inside of the container 20, the container 20 is rotated by the driving portion 26, and centrifugal separation is carried out again. Due to a centrifugal force exerted during the rotation, the first solid substance 36 held on the keeper discs 23 are removed from the keeper discs 23 (third step). At this time, as shown in FIG. 4, the first solid substance 36 is scattered and accumulated on the inner wall 20g of the trunk portion 20a of the container 20, but the second solid substance 37 also receives the centrifugal force during the rotation of the container 20 and remains held on the inner wall 20g of the trunk portion 20a of the container 20. Therefore, the first solid substance 36 and the second solid substance 37 are accumulated on the inner wall 20g of the trunk portion 20a. The accumulated substance on the inner wall 20g is removed in this state, whereby the first solid substance 36 and the second solid substance 37 are removed from the container 20 at the same time.

The first solid substance 36 and the second solid substance 37 are removed in a state in which the development fatigue liquid Qw is discharged from the inside of the container 20, and thus the moisture contents of the removed first solid substance 36 and second solid substance 37 are low. Therefore, in the case of disposing of the first solid substance 36 and the second solid substance 37 as a solid waste, the disposal amount can be decreased.

The development fatigue liquid Qw stored in the defoaming tank 27 is sent back to the development apparatus 14 through the pipe 28 using the pump 29. At this time, in the processing apparatus 12 of another embodiment shown in FIG. 9, the separation film 30 is provided in the pipe 28, and thus the solid substance included in the development fatigue liquid Qw is removed, and the development fatigue liquid Qw is sent back to the development apparatus 14. The development fatigue liquid Qw is used as the washout liquid Q (refer to FIG. 2) or a rinse liquid that washes away a gas remaining on the plate surface of the photosensitive resin plate 50 after the development and removal of the non-exposed portion.

The first solid substance 36 and the second solid substance 37 present in the container 20 are removed using the removal portion 33, which will be described using FIG. 5.

Figure 6:
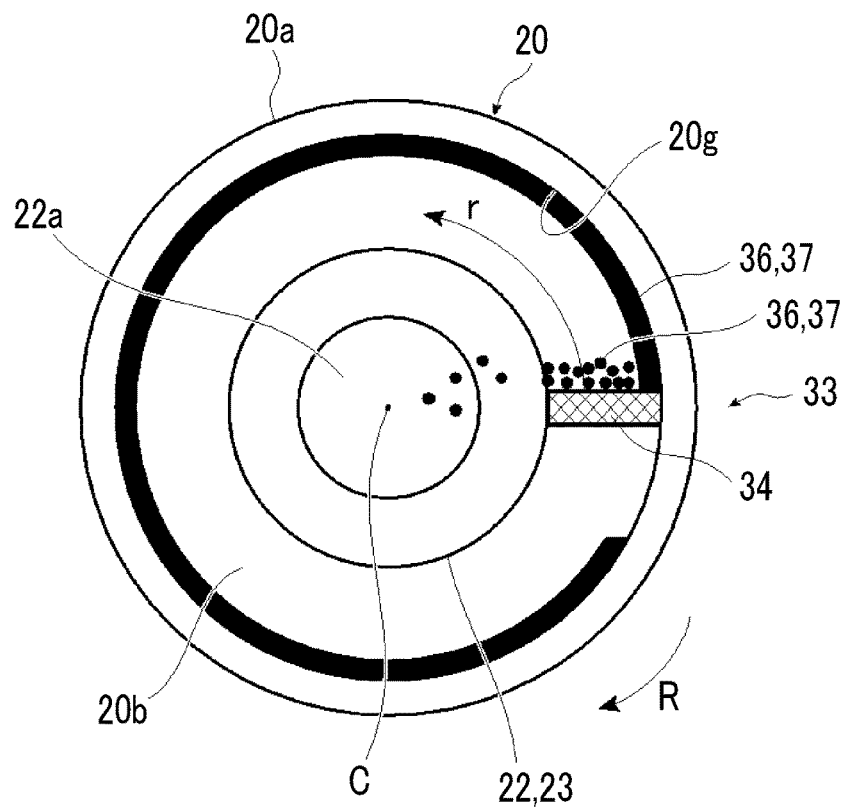
FIG. 6 is a schematic plan view showing an example of disposition of a scraper of the processing apparatus of the embodiment of the present invention.

In the case of removing the solid substance in the container 20 using the removal portion 33, as shown in FIG. 5, the tray 32 is disposed below the bottom surface 20d in a state in which the shutter 21c is opened in the opening portion 20f of the slope portion 20b and the bottom surface 20d of the bottom portion 20c is opened. In this state, the scraper 34 is rotated in the direction r opposite to the direction R in which the container 20 rotates as shown in FIG. 6. Therefore, the first solid substance 36 and the second solid substance 37 accumulated on the inner wall 20g of the container 20 are scraped, and the first solid substance 36 and the second solid substance 37 accumulated on the inner wall 20g are removed from the inside of the container 20 at the same time.

In the above-described processing method, the first solid substance 36 and the second solid substance 37 are removed at the same time, but the removal form is not limited thereto, and the first solid substance and the second solid substance may be removed separately. For example, after the centrifugal separation, the centrifugal separation is stopped, the development fatigue liquid Qw is discharged to the outside of the container 20, and then, that is, between the second step and the third step, the second solid substance 37 accumulated on the inner wall 20g of the container 20 is removed from the container 20 using the scraper 34. After that, the first solid substance 36 is removed from the keeper discs 23 by rotating the container 20 again (third step), and the first solid substance 36 is accumulated on the inner wall 20g of the container 20. After that, the first solid substance 36 is removed from the container 20 using the scraper 34.

As described above, even in a case where the first solid substance 36 and the second solid substance 37 are removed separately, the solid substance is removed in a state in which the development fatigue liquid Qw has been discharged from the container 20, and thus the first solid substance 36 and the second solid substance 37 are removed in a state in which the moisture contents are low. Therefore, in the case of disposing of the first solid substance 36 and the second solid substance 37 as a solid waste, the disposal amount can be decreased.

The disposal amount in the case of disposing of the first solid substance and the second solid substance as a solid waste can be decreased by, after the removal of the solid substances, carrying out a dehydration step on the first solid substance 36 and the second solid substance 37 removed from the inside of the container 20 to further decrease the moisture contents. As the dehydration step in this case, vacuum-type dehydration, heating-type dehydration, pressurization-type dehydration, centrifugal dehydration, and the like can be used, but the dehydration step is not limited thereto.

Figure 7:
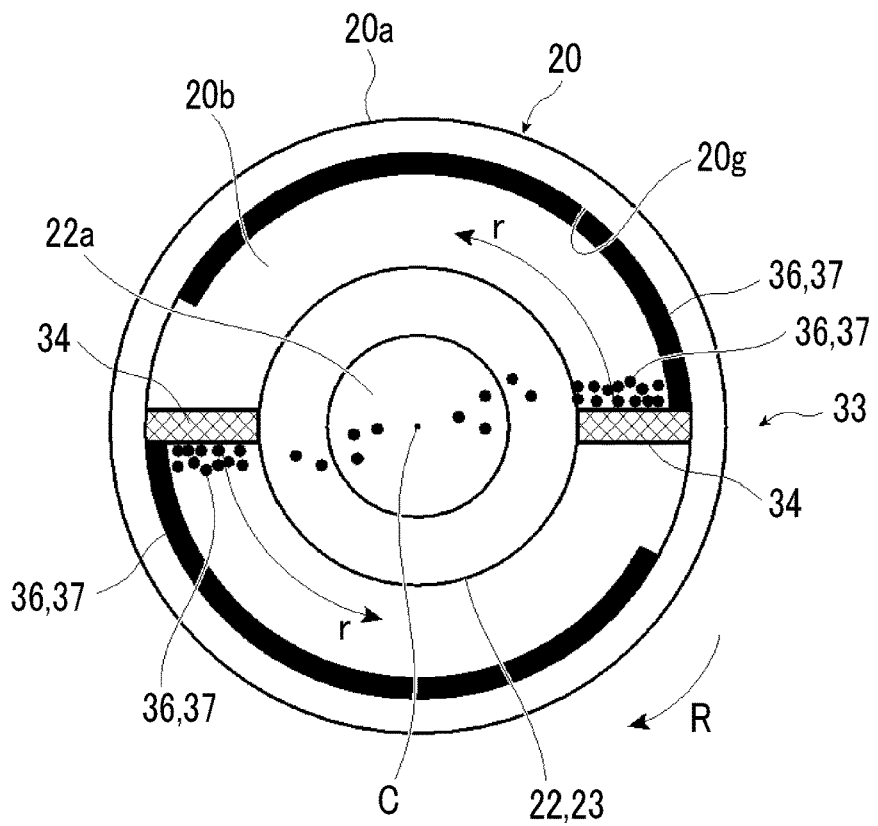
FIG. 7 is a schematic plan view showing another example of the disposition of a scraper of the processing apparatus of the embodiment of the present invention.

The processing apparatus 12 is provided with one scraper 34 in the configuration as shown in FIG. 6, but the number of the scrapers is not limited thereto, and, for example, as shown in FIG. 7, two scrapers 34 may be provided in the configuration. In this case, from the viewpoint of the removal efficiency, the scrapers 34 are preferably disposed opposite to each other. Furthermore, while not shown, four scrapers 34 may be provided in the configuration. In this case, the scrapers 34 are preferably disposed at equal intervals, that is, 90° intervals around the central axis C from the viewpoint of the removal efficiency. The scraper 34 is not limited to a flat plate that moves along the inner wall 20g.

In addition, regarding the configuration of the removal portion 33, the scraper 34 is disposed in the container 20, but the configuration is not limited thereto, and the scraper 34 may be configured to be inserted into the container 20 at the time of removing the solid substance. The removal portion 33 having the scrapers 34 that is inserted into the container 20 at the time of removing the solid substance may be provided as a separate body from the processing apparatus 12.

Furthermore, in addition to the scraper 34, means for spraying compressed air to the inner wall 20g of the container 20 (not shown) may be provided, and compressed air may be sprayed at the same time as or before or after the solid substance removal operation of the scraper 34.

Figure 8:
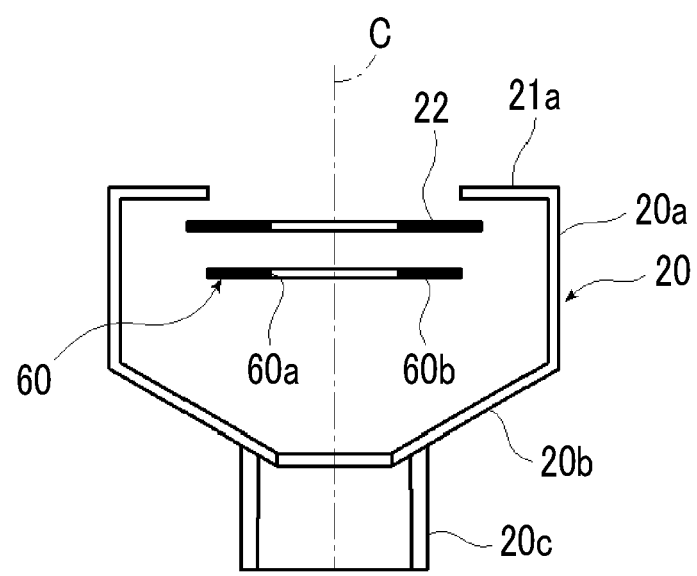
FIG. 8 is a schematic view showing a modification example of the processing apparatus of the embodiment of the present invention.

In all of the above-described processing apparatuses 12, three keeper discs 23 are provided in the configurations, but the number of the keeper discs is not limited thereto, and, as shown in FIG. 8, at least one keeper disc 60 needs to be provided in the configuration. The keeper disc 60 is, for example, a circular plate configured of an opening 60a and a main body portion 60b. The main body portion 60b of the keeper disc 60 needs to be present at a location at which the first solid substance 36 is accumulated by centrifugal separation. Meanwhile, FIG. 8 shows only the container 20.

In FIG. 8, the keeper disc 60 is provided; however, instead of the keeper disc 60, the keeper disc 23 that is an opening-free circular plate shown in FIG. 1 may be provided.

In addition, the processing of the development fatigue liquid Qw may be a batch method in which, after the development of the photosensitive resin plate, the development fatigue liquid Qw is supplied to the processing apparatus 12 from the development apparatus 14 and treated. In addition, the processing may be a continuous method in which the development fatigue liquid. Qw is supplied to the processing apparatus 12 from the development apparatus 14 and treated at all times. In a case where the amount of development is large, the continuous method is preferred.

In addition, the processing method of the development fatigue liquid Qw may have a step of reusing the development fatigue liquid Qw discharged from the container 20 as a washout liquid or a step of passing the development fatigue liquid Qw discharged from the container 20 through the separation film 30 (refer to FIG. 1) that removes the solid substance generated by development and reusing the development fatigue liquid as a washout liquid. As described above, the development fatigue liquid Qw is preferably caused to pass through the separation film 30 since it is possible to repetitively use the development fatigue liquid Qw.

Figure 10:
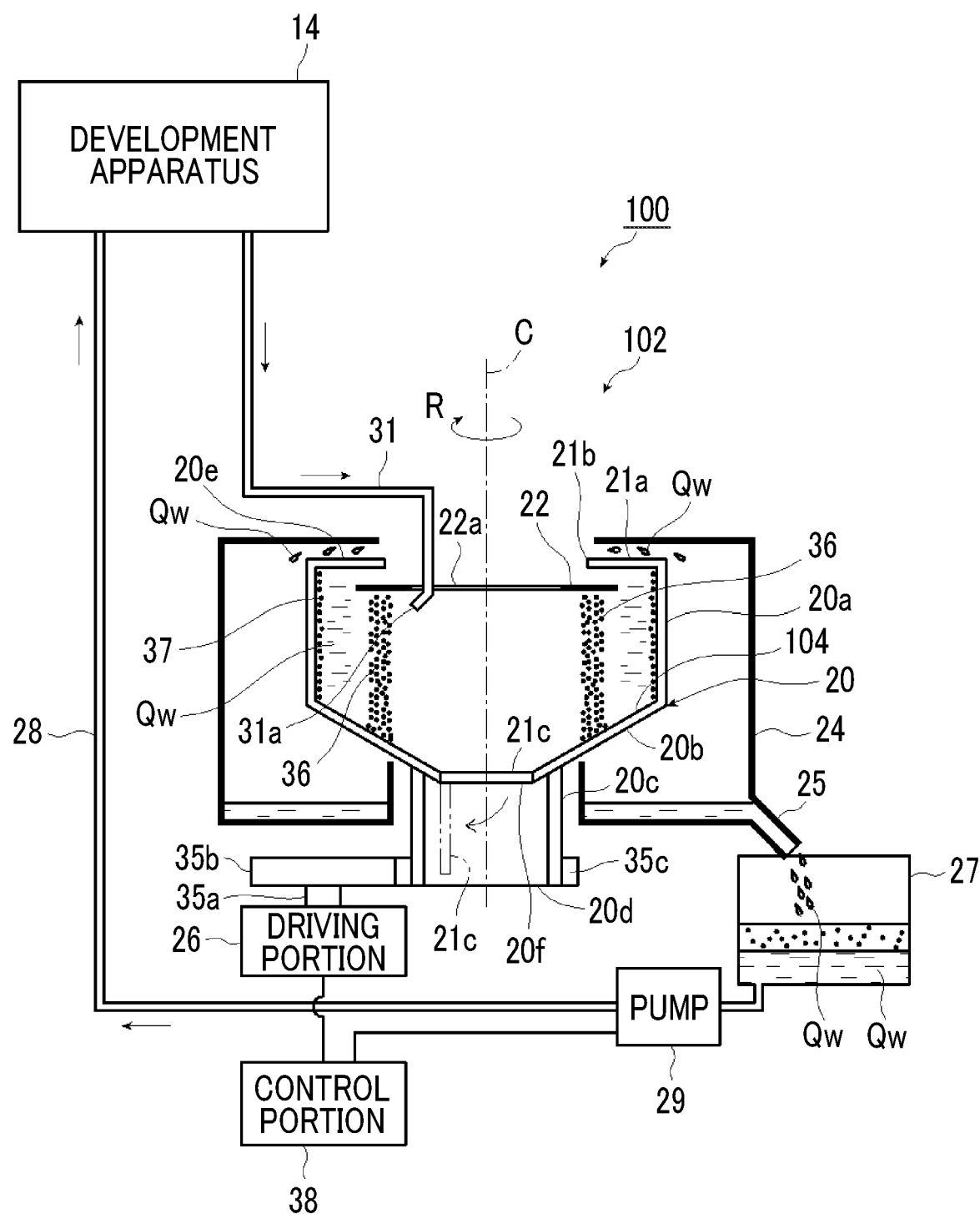
FIG. 10 is a schematic view showing a processing system having a processing apparatus for comparison.

FIG. 10 is a schematic view showing a processing system having a processing apparatus for comparison.

In a processing system 100 shown in FIG. 10, the same configuration substances as in the processing system 10 shown in FIG. 1 are given the same reference sign and will not be described in detail.

A processing apparatus 102 shown in FIG. 10 is different from the processing system 10 shown in FIG. 1 in terms of the fact that the keeper discs 23 are not provided in the processing apparatus 12, but is the same as the processing system 10 shown in FIG. 1 except for the above-described configuration.

As shown in FIG. 10, in the processing apparatus 102 not provided with the keeper discs 23, in the case of carrying out centrifugal separation by rotating the container 20, the first solid substance 36 is accumulated at a location in accordance with the mass due to a centrifugal force. However, in a case where the rotation of the container 20 is stopped, the first solid substance 36 is accumulated on an inner surface 104 of the slope portion 20b. In a case where the development fatigue liquid Qw in the container 20 is discharged to the case 24 in this state as in the above-described processing method, the development fatigue liquid Qw to be discharged to the case 24 includes a large amount of the first solid substance 36, and there is a concern that the concentration of the solid substance in the development fatigue liquid Qw may increase.

In addition, in a case where the amount of the solid substance accumulated on the inner surface 104 of the slope portion 20b is large, a large effort is required to remove the solid substance.

Hereinafter, the development fatigue liquid will be described in detail.

<Development Fatigue Liquid>

The development fatigue liquid that is the processing subject of the processing method of the embodiment of the present invention is not particularly limited as long as the development fatigue liquid is a washout liquid including a solid substance generated by the removal of a non-exposed portion by development using the washout liquid, that is, a washout liquid including a non-cured resin. However, it is possible to regard a development fatigue liquid including a well-known photosensitive resin composition of the related art which is intended to form an ordinary photosensitive resin layer as the processing subject.

In addition, in the processing method, the processing subject is preferably a development fatigue liquid generated from development using a laser ablation masking (LAM) method, and thus the non-cured resin that is removed by development is preferably a photosensitive resin included in a photosensitive resin composition.

In addition, as the above-described photosensitive resin composition, compositions containing, in addition to the photosensitive resin, for example, a polymerization initiator, a polymerizable compound, a polymerization inhibitor, a plasticizer, or the like are exemplified, and thus the development fatigue liquid that is the processing subject of the processing method of the embodiment of the present invention may contain, in addition to a non-cured resin, a polymerization initiator, a polymerizable compound, a polymerization inhibitor, a plasticizer, or the like.

<Non-Cured Resin>

The non-cured resin included in the development fatigue liquid refers to a solid substance generated by the removal of a non-exposed portion. As the non-cured resin included in the development fatigue liquid, for example, water-dispersible latex, a rubber component, a polymer component, a non-crosslinked ethylenic unsaturated compound (polymer), and the like are exemplified.

As the water-dispersible latex, water-dispersible latex polymers of a water-dispersible latex or the like such as polybutadiene latex, natural rubber latex, styrene-butadiene copolymer latex, acrylonitrile-butadiene copolymer latex, polychloroprene latex, polyisoprene latex, polyurethane latex, methyl methacrylate-butadiene copolymer latex, vinylpyridine copolymer latex, butyl polymer latex, thiokol polymer latex, and acrylate polymer latex, polymers obtained by copolymerizing the above-described polymer and another component such as acrylic acid or methacrylic acid, and the like are exemplified.

As the rubber component, butadiene rubber, isoprene rubber, styrene-butadiene rubber, acrylonitrile rubber, acrylonitrile butadiene rubber, chloroprene rubber, polyurethane rubber, silicon rubber, butyl rubber, ethylene-propylene rubber, epichlorohydrin rubber, and the like are exemplified.

The polymer component may be hydrophilic or hydrophobic, and, specifically, a polyamide resin, an unsaturated polyester resin, an acrylic resin, a polyurethane resin, a polyester resin, a polyvinyl alcohol resin, and the like are exemplified.

The solid substance having a smaller specific gravity than the washout liquid is, for example, a photosensitive resin such as a rubber component or latex.

The solid substance having a larger specific gravity than the washout liquid is, for example, a component of an overcoat layer such as carbon.

As the ethylenic unsaturated compound (polymer), for example, (meth)acrylic-modified polymers having an ethylenic unsaturated bond in the molecule and the like can be exemplified.

As the (meth)acrylic-modified polymers, for example, (meth)acrylic-modified butadiene rubber, (meth)acrylic-modified nitrile rubber, and the like can be exemplified.

"(Meth)acryl" is an expression representing acryl or methacryl, and "(meth)acrylate" described below is an expression representing an acrylate or a methacrylate.

The non-cured resin included in the development fatigue liquid is not particularly limited, but is preferably 70% by mass or less and more preferably 35% by mass or less.

<Polymerization Initiator>

As the polymerization initiator that may be included in the development fatigue liquid, a photopolymerization initiator is preferred.

As the photopolymerization initiator, for example, alkylphenones, acetophenones, benzoin ethers, benzophenones, thioxanthenes, anthraquinones, benzyls, biacetyls, and the like are exemplified, and, among these, alkylphenones are preferred.

As the alkylphenone photopolymerization initiator, specifically, for example, 2,2-dimethoxy-1,2-diphenylethane-1-one, 1-hydroxy-cyclohexyl-phenyl-ketone, 2-hydroxy-2-methyl-1-phenyl-propane-1-one, and the like are exemplified.

The concentration of the polymerization initiator that may be included in the development fatigue liquid is not particularly limited, but is preferably 2.0% by mass or less and more preferably 1.0% by mass or less.

<Polymerizable Compound>

As the polymerizable compound that may be included in the development fatigue liquid, for example, ethylenic unsaturated compounds corresponding to so-called monomer components other than the above-described ethylenic unsaturated compound (polymer) and the like are exemplified.

The ethylenic unsaturated compound may be a compound having one ethylenic unsaturated bond or may be a compound having two or more ethylenic unsaturated bonds.

As the compound having one ethylenic unsaturated bond, specifically, (meth)acrylates having a hydroxyl group such as 2-hydroxyethyl (meth)acrylate, 2-hydroxypropyl (meth)acrylate, 2-hydroxybutyl (meth)acrylate, 3-chloro-2-hydroxypropyl (meth)acrylate, β-hydroxy-β'-(meth)acryloyloxyethyl phthalate; alkyl (meth)acrylates such as methyl (meth)acrylate, ethyl (meth)acrylate, propyl (meth)acrylate, butyl (meth)acrylate, isoamyl (meth)acrylate, 2-ethylhexyl (meth)acrylate, lauryl (meth)acrylate, and stearyl (meth)acrylate; cycloalkyl (meth)acrylates such as cyclohexyl (meth)acrylate; halogenated alkyl (meth)acrylates such as chloroethyl (meth)acrylate and chloropropyl (meth) acrylate; alkoxyalkyl (meth)acrylates such as methoxyethyl (meth)acrylate, ethoxyethyl (meth)acrylate, and butoxyethyl (meth)acrylate; phenoxyalkyl (meth)acrylates such as phenoxyethyl acrylate and nonyl phenoxyethyl (meth)acrylate; alkoxy alkylene glycol (meth)acrylates such as ethoxydiethylene glycol (meth)acrylate, methoxytriethylene glycol (meth)acrylate, and methoxy dipropylene glycol (meth) acrylate; 2,2-dimethylaminoethyl (meth)acrylate, 2,2-diethylaminoethyl (meth)acrylate, 2-hydroxyethyl (meth)acrylate, 3-chloro-2-hydroxypropyl (meth)acrylate, and the like can be exemplified.

As the ethylenic unsaturated compound having two or more ethylenic unsaturated bonds, specifically, alkyl diol di(meth)acrylates such as 1,9-nonanediol di(meth) acrylate; polyethylene glycol di(meth) acrylates such as diethylene glycol di(meth)acrylate; polypropylene glycol di(meth)acrylates such as dipropylene glycol di(meth)acrylate; polyhydric (meth)acrylates obtained by causing an addition reaction of a compound having an ethylenic unsaturated bond such as unsaturated carboxlic acid or unsaturated alcohol and active hydrogen with trimethylolpropane tri(meth)acrylate, pentaerythritol tri(meth)acrylate, pentaerythritol tetra (meth)acrylate, glycerol tri(meth)acrylate, or ethylene glycol diglycidyl ether; polyhydric (meth)acrylates obtained by causing an addition reaction between an unsaturated epoxy compound such as glycidyl (meth)acrylate and a compound having carboxylic acid or active hydrogen such as an amine; polyhydric (meth)acrylamides such as methylenebis(meth) acrylamide; polyhydric vinyl compounds such as divinylbenzene; and the like can be exemplified.

The concentration of the polymerizable compound that may be included in the development fatigue liquid is not particularly limited, but is preferably 30.0% by mass or less and more preferably 15.0% by mass or less.

<Polymerization Inhibitor>

As the polymerization inhibitor that may be included in the development fatigue liquid, specifically, for example, hydroquinone monomethyl ether, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-tert-butylphenol), N-nitrosophenylhydroxyamine cerous salt, and the like are exemplified.

The concentration of the polymerization inhibitor that may be included in the development fatigue liquid is not particularly limited, but is preferably 0.3% by mass or less and more preferably 0.15% by mass or less.

<Plasticizer>

As the plasticizer that may be included in the development fatigue liquid, for example, liquid-form rubber, oil, polyesters, phosphoric acid-based compounds, and the like are exemplified.

As the liquid-form rubber, specifically, for example, liquid-form polybutadiene, liquid-form polyisoprene, rubber obtained by modifying the above-described rubber with maleic acid or an epoxy group, and the like are exemplified.

As the oil, specifically, for example, paraffin, naphthene, aroma, and the like are exemplified.

As the polyesters, specifically, for example, adipic acid-based polyesters and the like are exemplified.

As the phosphoric acid-based compounds, specifically, for example, phosphoric acid esters and the like are exemplified.

The concentration of the plasticizer that may be included in the development fatigue liquid is not particularly limited, but is preferably 30% by mass or less and more preferably 15% by mass or less.

<Washout Liquid>

The washout liquid included in the development fatigue liquid is preferably an aqueous washout liquid, may be a liquid only made of water, and may be an aqueous solution which contains 50% by mass or more of water and to which a water-soluble compound is added. As the water-soluble compound, a surfactant, an acid, an alkali, and the like are exemplified.

As the surfactant, an anionic surfactant, a nonionic surfactant, a cationic surfactant, and an amphoteric surfactant are exemplified, and, among these, an anionic surfactant is preferred.

As the anionic surfactant, specifically, aliphatic carboxylates such as sodium laurate and sodium oleate; higher alcohol sulfates such as sodium lauryl sulfate, sodium cetyl sulfate, sodium oleyl sulfate; polyoxyethylene alkyl ether sulfates such as sodium polyoxyethylene lauryl ether sulfate; polyoxyethylene alkyl allyl ether sulfates such as sodium polyoxyethylene octyl phenyl ether sulfate and sodium polyoxyethylene nonyl phenyl ether sulfate; alkyl sulfonates such as alkyl diphenyl ether disulfonate, sodium dodecyl sulfonate, and sodium dialkyl sulfosuccinate; alkyl allyl sulfonates such as alkyl disulfonate, sodium dodecyl benzene sulfonate, sodium dibutyl naphthalene sulfonate, and sodium triisopropyl naphthalene sulfonate; higher alcohol phosphates such as disodium lauryl phosphate monoester and sodium lauryl phosphate diester; polyoxyethylene alkyl ether phosphates such as disodium polyoxyethylene lauryl ether phosphate monoester and sodium polyoxyethylene lauryl ether phosphate diester; and the like are exemplified. These anionic surfactants may be used singly or two or more anionic surfactants may be jointly used. Sodium salts have been exemplified as specific examples, but the anionic surfactant is not particularly limited to sodium salts, and the same effect can be obtained even in a case where the anionic surfactant is a calcium salt, an ammonium salt, or the like.

As the nonionic surfactant, specifically, salt compounds exhibiting alkalinity such as polyoxyethylene alkyl ethers such as polyoxyethylene oleyl ether or polyoxyethylene lauryl ether, polyoxyethylene polyoxypropylene glycols such as polyoxyethylene alkyl phenyl ether such as polyoxyethylene nonyl phenyl ether or polyoxyethylene octyl phenyl ether, mono- and diesters of an aliphatic acid and polyethylene glycol such as polyethylene glycol monostearate, polyethylene glycol monoolate, or polyethylene glycol dilaurate, esters of an aliphatic acid and sorbitan such as sorbitan monolaurate or sorbitan monooleate, esters of a polyoxyethylene adducts of sorbitan and an aliphatic acid such as polyoxyethylene sorbitan monolaurate, polyoxyethylene sorbitan monocyanate, or polyoxyethylene sorbitan trilaurate, esters of an aliphatic acid and sorbit such as sorbit monopalmitate or sorbit dilaurate, esters of a polyoxyethylene adduct of sorbit and an aliphatic acid such as polyoxyethylene sorbit monostearate or polyoxyethylene sorbit diolate, esters of an aliphatic acid and pentaerythritol such as pentaerythritol monostearate, esters of an aliphatic acid and glycerin such as glycerin monolaurate, aliphatic acid alkanolamides such as lauric acid diethanolamide or lauric acid monoethanolamide; amine oxides such as lauryldimethylamine oxide, aliphatic acid alkanolamines such as stearyl diethanolamine, polyoxyethylene alkylamines, triethanolamine aliphatic acid esters, phosphates, carbonates, and silicates. These nonionic surfactants may be used singly or two or more nonionic surfactants may be jointly used.

As the cationic surfactant, specifically, primary, secondary, and tertiary amines such as monostearyl ammonium chloride, distearyl ammonium chloride, and tristearyl ammonium chloride, quaternary amines such as stearyl trimethyl ammonium chloride, distearyl dimethyl ammonium chloride, and stearyl dimethyl benzyl ammonium chloride, alkyl pyridinium salts such as N-cetyl pyridinium chloride or N-stearyl pyridinium chloride, N,N dialkyl morpholinium salts, aliphatic acid amide salts of polyethylene polyamine, acetate salts of an urea compound of amides of aminoethyl ethanolamine and stearic acid, 2-alkyl-1-hydroxyethyl imidazolinium chloride, and the like are exemplified. These cationic surfactants may be used singly or two or more cationic surfactants may be jointly used.

As the amphoteric surfactant, specifically, amino acid-type surfactants such as sodium laurylamine propionate, carboxy betaine-type surfactants such as lauryl dimethyl betaine or lauryl dihydroxyethyl betaine, sulfobetaine-type surfactants such as stearyl dimethyl sulfoethylene ammonium betaine, imidazolinium betaine-type surfactants, lecithin, and the like are exemplified. These amphoteric surfactants may be used singly or two or more amphoteric surfactants may be jointly used.

As the acid, specifically, for example, inorganic acids or organic acids such as hydrochloric acid, sulfuric acid, nitric acid, phosphoric acid, formic acid, acetic acid, oxalic acid, succinic acid, citric acid, malic acid, maleic acid, and p-toluenesulfonic acid are exemplified.

As the alkali, specifically, for example, lithium hydroxide, sodium hydroxide, magnesium hydroxide, potassium hydroxide, calcium hydroxide, calcium oxide, sodium carbonate, sodium hydrogen carbonate, calcium carbonate, and the like are exemplified.

The present invention is, basically, configured as described above. Hitherto, the processing method and the processing apparatus of the embodiment of the present invention have been described in detail, but the present invention is not limited to the above-described embodiments, and it is needless to say that a variety of improvements or modifications may be carried out within the scope of the gist of the present invention.

EXAMPLES

Hereinafter, characteristics of the present invention will be more specifically described using examples. Materials, chemicals, amounts used, amounts of substances, proportions, processing contents, processing orders, and the like described in the following examples can be appropriately modified within the scope of the gist of the present invention. Therefore, the scope of the present invention is not supposed to be interpreted to be limited by specific examples described below.

In the present examples, development fatigue liquids were treated using processing apparatuses of Examples 1 to 3 and Comparative Examples 3 and 4 described below in processing amounts shown in Table 1 below. Hereinafter, the concentration of a solid content of the development fatigue liquid refers to the concentration of the solid content of the development fatigue liquid discharged from a container 20 after centrifugal processing in Examples 1 to 3 and Comparative Examples 3 and 4 and refers to the concentration of the solid content of the development fatigue liquid in Comparative Examples 1 and 2. The concentrations of the solid contents of the development fatigue liquids and moisture contents of discharged solid substances were measured. The concentrations of the solid contents of the development fatigue liquids and the moisture contents of the discharged solid substances are shown in Table 1.

Apparatuses and chemicals used to obtain development fatigue liquids treated in Examples 1 to 3 and Comparative Examples 1 to 4 will be described below.

<Imaging Machine>
CDI Spark 4835 Inline (manufactured by Esko)
<Stepper>
Ultraviolet stepper Concept 302 ECDLF (product name) (manufactured by Glunz & Jensen)
<Developing Machine>
SB-926 (manufactured by GS TR)
<Photosensitive Resin Plate>
FLENEX FW-L (manufactured by Fujifilm Global Graphics Systems Co., Ltd.)
<Washout Liquid>
Aqueous solution of FINISH POWER & PURE POWDER SP (manufactured by Reckitt Benckiser Japan Ltd.) (200 liters, concentration: 0.5% by mass)
<Centrifugal Separator>
UB-S1 (manufactured by Ameroid Japan Service Co., Ltd.)
<Preparation of Development Fatigue Liquid>

Examples 1 to 3 and Comparative Examples 1 to 4

Back exposure was carried out by exposing a back surface of the photosensitive resin plate using the ultraviolet stepper with an energy of 80 W for 10 seconds. After that, imaging was carried out by abrading a mask layer using the imaging machine, and main exposure was carried out by exposing a surface (a back surface of the back surface) with 80 W for 1,000 seconds.

The main-exposed photosensitive resin plate was developed under a condition of 50° C. using the washout liquid, the washout machine SB-926, and a brush to remove a non-exposed portion, thereby obtaining a development fatigue liquid.

<Method for Measuring Concentration of Solid Content of Development Fatigue Liquid>

The development fatigue liquid (10 g) that was a measurement subject was put into an aluminum container and dried at 95° C. for 12 hours in an oven PHH-201 (manufactured by ESPEC Corp.).

After the drying, the mass of a residue was measured, thereby obtaining the concentration of the solid content of the development fatigue liquid. The results are shown in the "concentration of solid content of development fatigue liquid (% by mass)" column of Table 1.

<Method for Measuring Moisture Content of Discharged Solid Substance>

The dry weight method was used for the moisture content of a discharged solid substance. A sample was put into a heating oven and dried, the moisture content after the drying was regarded as 0%, and the moisture content was obtained from the weights before and after the drying. The results are shown in the "moisture content of discharged solid substance (% by mass)" column of Table 1.

Next, Examples 1 to 3 and Comparative Examples 1 to 4 will be described.

Example 1

In Example 1, the above-described development fatigue liquid was treated using a processing apparatus having a configuration shown in FIG. 1. In Example 1, centrifugal separation was carried out, the centrifugal separation was temporarily stopped, and then a container was rotated again. In addition, for the removal of the solid substance in the container, a scraper and compressed air spraying were used.

In the expression "2,500 rpm·5 L/minute" in the "centrifugal separation" column of Table 1, "2,500 rpm" indicates the rotation speed during the centrifugal separation. "5 L/minute (liters/minutes)" indicates the amount of the development fatigue liquid flowing into the centrifugal separator.

Example 2

Example 2 is different from Example 1 in terms of the processing amount, but is the same as Example 1 except for the processing amount. The processing amount refers to the area in square meters ($m^2$) of the photosensitive resin plate that is development-treated and represents the total area ($m^2$) of the development-treated photosensitive resin plate.

Example 3

Example 3 is different from Example 1 in terms of the fact that a processing apparatus having a separation film having a configuration shown in FIG. 9 was used, but is the same as Example 1 except for the above-described fact. As the separation film, a filter having a separation capacity of 0.1 μm (Cobetter membrane filter APSHA0010) was used.

Comparative Example 1

In Comparative Example 1, for a development fatigue liquid having a processing amount of 20 $m^2$, the concentration of the solid content of the development fatigue liquid was measured. In Comparative Example 1, the development fatigue liquid was not passed through any filter.

In Comparative Example 1, the moisture content (% by mass) of the discharged solid substance was not measured, and thus a reference sign "-" is shown in the "moisture content of discharged solid substance (% by mass)" column.

Comparative Example 2

In Comparative Example 2, for a development fatigue liquid having a processing amount of 25 $m^2$, the concentration of the solid content of the development fatigue liquid was measured. In Comparative Example 2, the development fatigue liquid was not passed through any filter.

In Comparative Example 2, the moisture content (% by mass) of the discharged solid substance was not measured, and thus a reference sign "-" is shown in the "moisture content of discharged solid substance (% by mass)" column.

Comparative Example 3

Comparative Example 3 is different from Example 1 in terms of the fact that a processing apparatus not having a keeper disc having a configuration shown in FIG. 10 was used and the container was not rotated again after centrifugal separation, but is the same as Example 1 except for the above-described fact.

Comparative Example 4

Comparative Example 4 is different from Comparative Example 3 in terms of the processing amount, but is the same as Comparative Example 3 except for the processing amount.

TABLE 1

| | Centrifugal separation | Keeper disc | Filter | Processing amount (m²) | Concentration of solid content of development fatigue liquid (% by mass) | Moisture content of discharged solid substance (% by mass) |
|---|---|---|---|---|---|---|
| Example 1 | 2500 rpm · 5 L/minute | Yes | No | 20 | 1.3 | 62 |
| Example 2 | 2500 rpm · 5 L/minute | Yes | No | 40 | 2.4 | 62 |
| Example 3 | 2500 rpm · 5 L/minute | Yes | Yes | 40 | 0.6 | 58 |
| Comparative Example 1 | N/A | — | No | 20 | 4.2 | — |
| Comparative Example 2 | N/A | — | No | 25 | 5.2 | — |
| Comparative Example 3 | 2500 rpm · 5 L/minute | No | No | 20 | 2.0 | 79 |
| Comparative Example 4 | 2500 rpm · 5 L/minute | No | No | 40 | 3.9 | 79 |

As shown in Table 1, in Examples 1 to 3, compared with Comparative Examples 1 to 4, the moisture contents of the discharged solid substance were smaller.

In Example 1 and Comparative Example 3 in which the processing amounts were the same as each other, the concentration (% by mass) of the solid content of the development fatigue liquid was smaller in Example 1. In addition, in Example 2 and Comparative Example 4 in which the processing amounts were the same as each other and no filter was provided, the concentration (% by mass) of the solid content of the development fatigue liquid was smaller in Example 2.

From the above-described facts, the effect of the holding member is clear.

EXPLANATION OF REFERENCES 10, 10a, 100: processing system
12, 102: processing apparatus
14: development apparatus
20: container
20a: trunk portion
20b: slope portion
20c: bottom portion
20d: bottom surface
20e: opening
20f: opening portion
20g: inner wall
21a: lid
21b: opening portion
21c: shutter
22: inside disc
22a: opening
23, 60: keeper disc
24: case
25: discharge path
26: driving portion
27: defoaming tank
28, 31: pipe
29: pump
30: separation film
31a: opening
32: tray
33: removal portion
34: scraper
35a: driving shaft
35b: driving gear
35c: driven gear
36: first solid substance
37: second solid substance
38: control portion
40: development tank
42: brush
43: driving member
44: supply pipe
46: supply portion
47: valve
50: photosensitive resin plate
50a: surface
60a: opening
60b: main body portion
104: inner surface
C: central axis
Q: washout liquid
Qw: development fatigue liquid
R: direction
r: direction

What is claimed is:

1. A processing method for removing a first solid substance having a smaller specific gravity than a washout liquid and a second solid substance having a larger specific gravity than the washout liquid from a development fatigue liquid including a solid substance generated by removal of a non-exposed portion of a photosensitive resin plate that has been exposed in an image shape by development using the washout liquid, the method comprising:
 a first step of centrifugally separating the first solid substance and the second solid substance included in the development fatigue liquid in a rotating container, accumulating the second solid substance on an inner wall of the container, and accumulating the first solid substance on a holding member provided in the container;
 a second step of stopping the centrifugal separation and discharging the development fatigue liquid from the container in a state in which the first solid substance accumulated on the holding member is held on the holding member; and a third step of rotating the container, thereby removing the first solid substance held on the holding member from the holding member.

2. The processing method according to claim 1, further comprising:
   a step of removing the second solid substance from the container between the second step and the third step; and
   a step of removing the first solid substance from the container after the third step.

3. The processing method according to claim 2, further comprising:
   a step of reusing the development fatigue liquid discharged from the container as the washout liquid or a step of passing the development fatigue liquid discharged from the container through a separation film that removes the solid substance generated by the development and reusing the development fatigue liquid as the washout liquid.

4. The processing method according to claim 1, further comprising:
   a step of removing the first solid substance and the second solid substance from the container at the same time after the third step.

5. The processing method according to claim 4, further comprising:
   a step of reusing the development fatigue liquid discharged from the container as the washout liquid or a step of passing the development fatigue liquid discharged from the container through a separation film that removes the solid substance generated by the development and reusing the development fatigue liquid as the washout liquid.

6. The processing method according to claim 1, further comprising:
   a step of reusing the development fatigue liquid discharged from the container as the washout liquid or a step of passing the development fatigue liquid discharged from the container through a separation film that removes the solid substance generated by the development and reusing the development fatigue liquid as the washout liquid.

7. A processing apparatus comprising:
   a container that has an opening portion and stores a development fatigue liquid including a solid substance generated by removal of a non-exposed portion of a photosensitive resin plate that has been exposed in an image shape by development using a washout liquid;
   a driving portion that centrifugally separates a first solid substance having a smaller specific gravity than the washout liquid and a second solid substance having a larger specific gravity than the washout liquid in the container by rotating the container;
   a confining member that is provided in the container so as to face the opening portion and stores the first solid substance in the container;
   at least one holding member that is provided in the container opposite to the opening portion across the confining member and holds the first solid substance that is accumulated by the centrifugal separation; and
   a control portion that rotates the container in which the development fatigue liquid is stored by the driving portion to carry out the centrifugal separation, accumulates the first solid substance on the holding member, stops rotation of the container by the driving portion, discharges the development fatigue liquid from the container in a state in which the first solid substance accumulated on the holding member is held on the holding member, and then rotates the container by the driving portion again.

8. The processing apparatus according to claim 7, further comprising:
   a removal portion that removes the first solid substance and the second solid substance present in the container from the container.

9. The processing apparatus according to claim 8, wherein the confining member is a circular plate having an opening, and the holding member is a circular plate or a circular plate having an opening.

10. The processing apparatus according to claim 9, further comprising:
   a separation film that removes the solid substance generated by the development,
   wherein the development fatigue liquid discharged from the container is reused as the washout liquid after being passed through the separation film or is reused as the washout liquid without being passed through the separation film.

11. The processing apparatus according to claim 9, wherein the development fatigue liquid discharged from the container is reused as the washout liquid.

12. The processing apparatus according to claim 8, further comprising:
   a separation film that removes the solid substance generated by the development,
   wherein the development fatigue liquid discharged from the container is reused as the washout liquid after being passed through the separation film or is reused as the washout liquid without being passed through the separation film.

13. The processing apparatus according to claim 8, wherein the development fatigue liquid discharged from the container is reused as the washout liquid.

14. The processing apparatus according to claim 7, wherein the confining member is a circular plate having an opening, and the holding member is a circular plate or a circular plate having an opening.

15. The processing apparatus according to claim 14, further comprising:
   a separation film that removes the solid substance generated by the development,
   wherein the development fatigue liquid discharged from the container is reused as the washout liquid after being passed through the separation film or is reused as the washout liquid without being passed through the separation film.

16. The processing apparatus according to claim 14, wherein the development fatigue liquid discharged from the container is reused as the washout liquid.

17. The processing apparatus according to claim 7, further comprising:
   a separation film that removes the solid substance generated by the development,
   wherein the development fatigue liquid discharged from the container is reused as the washout liquid after being passed through the separation film or is reused as the washout liquid without being passed through the separation film.

18. The processing apparatus according to claim 7, wherein the development fatigue liquid discharged from the container is reused as the washout liquid.

* * * * *